United States Patent [19]

Tanaka et al.

[11] Patent Number: 4,944,246
[45] Date of Patent: Jul. 31, 1990

[54] MOLECULAR BEAM EPITAXY APPARATUS

[75] Inventors: Haruo Tanaka, Shiga; Masato Mushiage, Kyoto; Yuhji Ishida, Osaka, all of Japan

[73] Assignee: Rohm Co., Ltd., Kyoto, Japan

[21] Appl. No.: 329,313

[22] Filed: Mar. 27, 1989

[30] Foreign Application Priority Data

Mar. 30, 1988 [JP] Japan ................ 63-42830[U]
Mar. 30, 1988 [JP] Japan ................ 63-77798[U]
Apr. 8, 1988 [JP] Japan ................ 63-87918

[51] Int. Cl.$^5$ ............................................ C23C 16/00
[52] U.S. Cl. ............................ 118/729; 118/719; 118/725; 118/726; 156/611; 156/612; 156/613; 156/DIG. 103; 414/217; 414/222
[58] Field of Search .............. 118/719, 724, 725, 726, 118/728, 729, 730; 156/610, 611, 612, 613, DIG. 103; 414/217, 222; 148/DIG. 169

[56] References Cited

U.S. PATENT DOCUMENTS

| | | | |
|---|---|---|---|
| 3,839,084 | 10/1974 | Cho et al. ........................ | 156/611 |
| 4,569,829 | 2/1986 | Shih ................................ | 118/726 |
| 4,592,308 | 6/1986 | Shih et al. ....................... | 118/726 |
| 4,605,469 | 8/1986 | Shih ................................ | 156/610 |
| 4,636,268 | 1/1987 | Tsang .............................. | 156/611 |
| 4,664,062 | 5/1987 | Kamohara et al. ............... | 118/719 |
| 4,664,063 | 5/1987 | Ashizawa et al. ................ | 118/724 |
| 4,681,773 | 7/1987 | Bean ............................... | 118/719 |
| 4,810,473 | 3/1989 | Tamura et al. ................... | 118/719 |

FOREIGN PATENT DOCUMENTS 60-108400 6/1985 Japan ................................ 118/726

Primary Examiner—Richard Bueker
Assistant Examiner—Terry J. Owens
Attorney, Agent, or Firm—William H. Eilberg

[57] ABSTRACT

A molecular beam epitaxy apparatus comprises a growth chamber provided therein with a holder support frame and connected via a first gate valve to a preparation chamber which in turn is connected to a loading chamber via a second gate valve. A first transfer tray arranged in the loading chamber receives a set of substrates from outside and advances into the preparation chamber. A second transfer tray supports a substrate holder in the preparation chamber to allow the set of substrates to be transferred from the first tray onto the holder by the aid of a substrate transfer assembly. The second tray is advanced into the growth chamber to transfer the loaded holder onto the holder support frame.

17 Claims, 10 Drawing Sheets

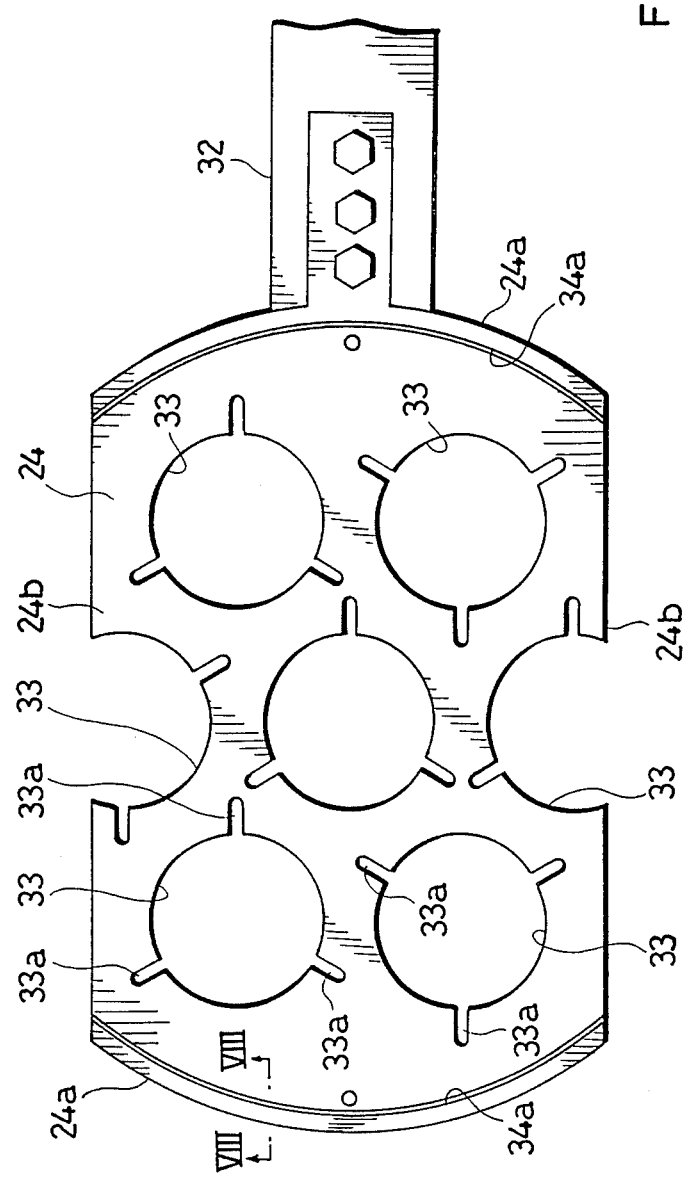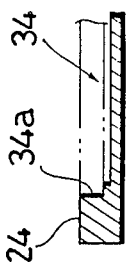

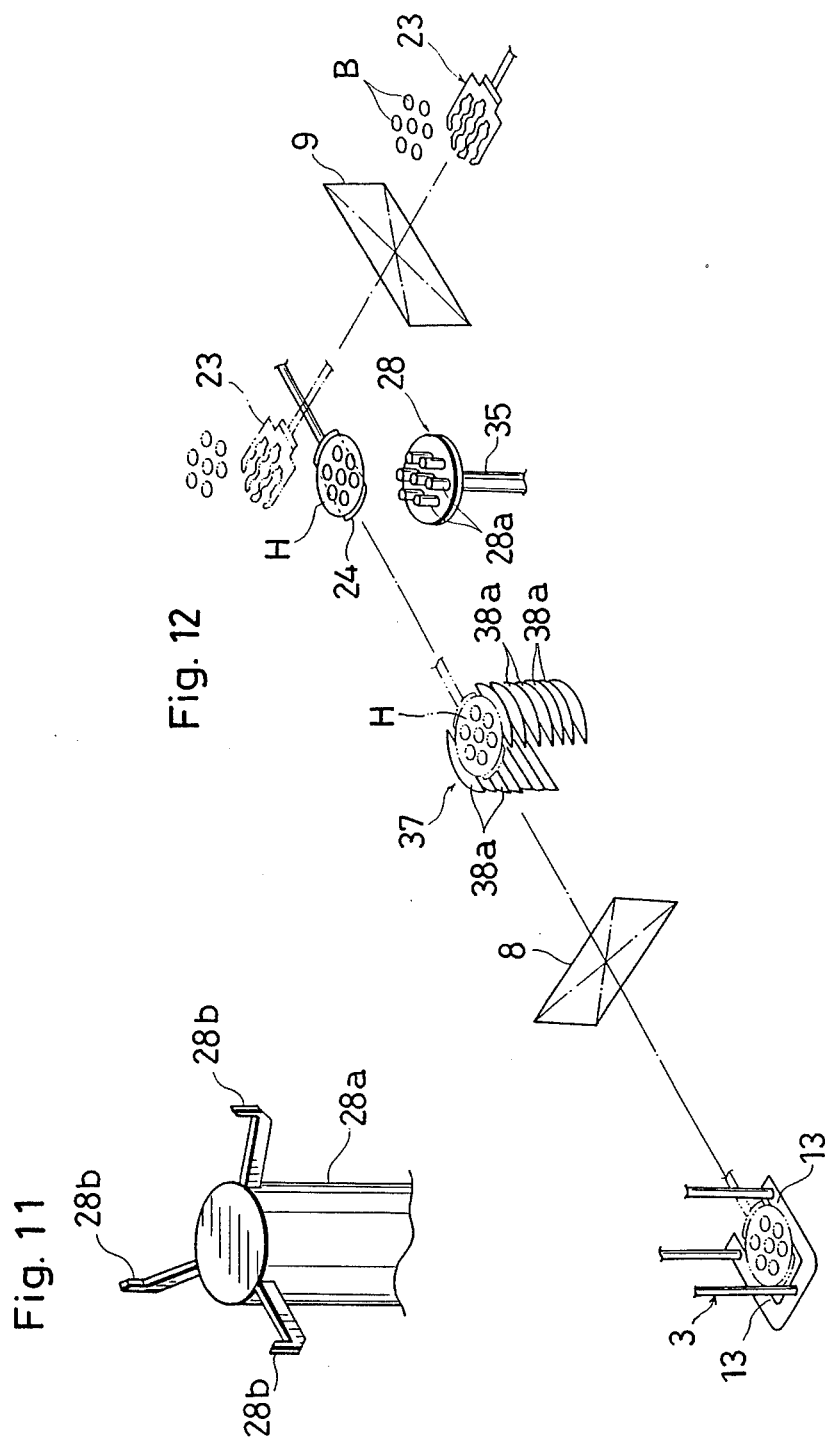

MOLECULAR BEAM EPITAXY APPARATUS

BACKGROUND OF THE INVENTION

1. Field of the Invention

This invention relates generally to molecular beam epitaxy, and more particularly to improvements in a molecular beam epitaxy apparatus.

2. Description of the Prior Art

Molecular beam epitaxy (often abbreviated to "MBE") has attracted attentions as a method for epitaxially growing a thin layer on a monocrystal substrate in the production of compound semiconductors, particularly group III-V compound semiconductors. In MBE, which is one of the vacuum deposition methods, group III elements such as Ga, Al, In and group V elements such as As, P are emitted in the form of molecular or atomic beams ($As_2$ or $As_4$ in the case of arsenic) under a ultra high vacuum of e.g. $10^{-11}$ Torr, and deposited on a monocrystal substrate of e.g. GaAs, InP to form an epitaxial layer or layers of e.g. GaAs, AlGaAs, InP, InGaAsP.

The MBE is known to have various advantages. Several of these advantages are as follows:

(1) Due to the use of a ultra high vacuum, it is possible to always keep clean the growth front of each substrate by expelling gaseous impurities, consequently improving the product quality.

(2) Because of high vacuum, it is possible to deposit a uniform layer or film over a large area.

(3) It is possible to precisely control the film thickness in angstroms because the crystal growth rate can be made very low and accurately adjusted.

(4) It is possible to readily obtain a thin film of multicomponent mixed crystals by simply increasing molecular beam sources.

(5) Molecular beams used for crystal formation can be also used to detect the surface or growth conditions during crystal growth, so that useful information can be immediately fed back for controlling the crystal growth.

For further understanding of the MBE technique, reference is now made to FIGS. 14 and 15 of the accompanying drawings which show a typical conventional MBE apparatus.

As shown in FIG. 14, the prior art MBE apparatus comprises a growth chamber 102 connected to a high vacuum pump 101 for evacuating the chamber interior to a ultra high vacuum. Centrally within the chamber 102 is a holder support 103 which is controllably rotated about a central vertical axis L. The support 103 receives a substrate holder H' loaded with a plurality of substrates B' (see FIG. 15). Rotation of the holder support is required to ensure uniform crystal deposition on every substrate B'. The support 103 is provided with a heater (not shown) to heat the substrate to a temperature suitable for crystal growth.

The growth chamber 102 is provided at its bottom with a plurality (only two shown) of molecular beam sources or vaporizers 105 disposed in an annular arrangement around the central vertical axis L of the growth chamber for generating molecular beams of different materials. Each source 105 is substantially equally spaced from the substrate holder H', and has a longitudinal axis A directed to the center of the holder. The source 105 includes a crucible 104 for receiving a suitable material which is heated by a heater (not shown) for vaporization. The source 105 further includes a shroud or cool trap 106 to which is supplied liquid nitrogen for preventing the source from being thermally influenced by the other sources. The molecular beam emission is controlled by opening and closing a shutter 107 arranged at the emission opening of the vaporizer 105.

For depositing a GaAs layer on GaAs monocrystal substrates for example with the above apparatus, two of the vaporizers 105 for Ga and As respectively are heated while the substrate H' with the substrates B' is also heated to a suitable temperature, and thereafter the relevant shutters 107 are opened for a predetermined period. An additional element Al may be simultaneously vaporized to form a $Ga_xAl_{1-x}As$ layer in which the value of x is determined by the ratio in vaporized amount between Ga and Al. Further, simultaneous vaporization of Si or Sn provides a n-type crystal layer, whereas simultaneous inclusion of Be or Mg provides a p-type crystal layer.

As shown in FIG. 15, the MBE apparatus further comprises a preparation chamber 110 connected to the growth chamber 102 via a first gate valve 108. The preparation chamber 110 is provided with a second gate valve 109 for hermetically separating the preparation chamber from the atmosphere.

For feeding a new set of substrates, the first gate valve 108 is held closed while the second gate valve 109 is opened, and the set of substrates B' retained by the substrate holder H' is supplied from outside into the preparation chamber 110 through the open second gate valve 109. Subsequently, the second gate valve is closed, and the preparation chamber is evacuated to a high vacuum, whereupon the first gate valve 108 is opened to supply the substrate set into the growth chamber. In this way, the time required for re-evacuating the growth chamber 102 to a ultra high vacuum is greatly reduced, thereby increasing the productivity of the apparatus.

In the absence of the preparation chamber, obviously, vacuum leakage upon feeding a new set of substrates makes it necessary to re-evacuate the growth chamber from the very start, consequently requiring a long time. It is for this reason that the MBE has been formerly evaluated only as an experimental or research tool.

The arrangement shown in FIG. 15 opens up (gives at least a hint to) the way for application of the MBE on commercial scale. However, such an arrangement still has the following disadvantage.

According to the arrangement of FIG. 15, not only the set of substrates B' but also the holder H' therefor must be supplied from the exterior. When brought into the growth chamber 102, the holder, which is usually made of molybdenum or a molybdenum alloy to ensure high strength, stability at high temperature and corrosion resistance, will allow simultaneous entry of adhered moisture content, air or other contaminants into the growth chamber. Because the requirements for the interior condition of the growth chamber during crystal growth are very stringent, it is difficult or time-taking to acceptably expel the adhered contaminants by evacuation.

SUMMARY OF THE INVENTION

It is, therefore, an object of the invention to provide an MBE apparatus which is capable of maximally reducing the time required for degassing substrate holders before starting crystal growth, thereby increasing the productivity of the apparatus.

Another object of the invention is to provide an MBE apparatus which is operable continually with a maximally shortened cycle time.

A further object of the invention is to provide an MBE apparatus which is operable for a prolonged period per single supply of crystal materials.

Still another object of the invention is to provide an MBE apparatus which is capable of incorporating as many molecular beam sources as possible, thereby enabling epitaxial growth of crystal layers of various compositions.

Still further object of the invention is to provide an MBE apparatus which reduces the likelihood of malfunction.

Still further object of the invention is to provide an MBE apparatus which provides easy maintenance.

According to the invention, there is provided a molecular beam epitaxy apparatus comprising: a growth chamber evacuatable to a ultra high vacuum; holder support means arranged in said growth chamber; a preparation chamber connected to said growth chamber via a first gate valve and evacuatable to a high vacuum; a loading chamber connected to said preparation chamber via a second gate valve and evacuatable to a high vacuum; a first transfer member arranged in said loading chamber for receiving at least one substrate at a time, said first member being movable into said preparation chamber through the open second valve to assume an advanced transfer position; a second transfer member arranged in said preparation chamber for placing thereon a substrate holder, said second member being movable from a retreated transfer position into said growth chamber through the open first valve to enable transfer of the holder between said second member and said holder support means; and a substrate transfer assembly arranged in said preparation chamber to transfer the or each substrate between said first member in said advanced transfer position and the holder placed on said second member in said retreated transfer position.

Other objects, features and advantages of the invention will be fully understood from the following detailed description given with reference to the accompanying drawings.

BRIEF DESCRIPTION OF THE DRAWINGS

In the accompanying drawings:

FIG. 7 is a plan view showing a second transfer tray incorporated in the MBE apparatus of FIG. 1;

FIG. 8 is a sectional view taken on lines VIII—VIII in FIG. 7;

FIG. 11 is a perspective view showing a post of the substrate transfer assembly illustrated in FIG. 3;

FIG. 12 is a schematic perspective view showing the flow of substrates together with the corresponding holder within the MBE apparatus of FIG. 1;

DETAILED DESCRIPTION

Figure 1:
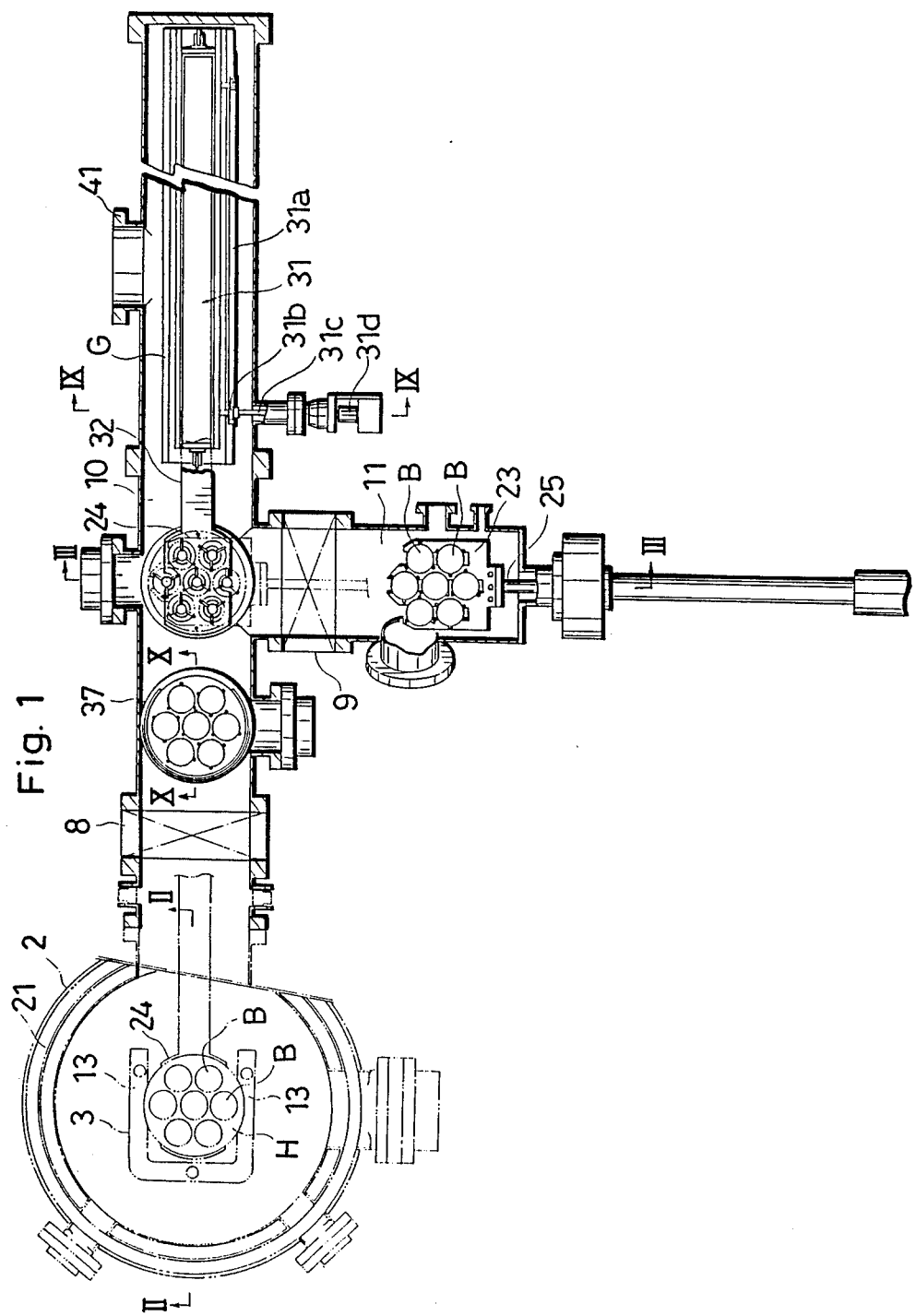
FIG. 1 is a plan view showing the whole arrangement of an MBE apparatus embodying the invention.

Referring to FIG. 1 of the accompanying drawings, a molecular beam epitaxy apparatus according to the invention mainly includes a growth chamber 2, a substrate preparation chamber 10 connected to the growth chamber by means of a first gate valve 8, and a substrate loading chamber 11 connected to the preparation chamber by means of a second gate valve 9. Crystal growth occurs within the growth chamber 2 simultaneously with respect to a plurality of substrates or wafers B held by a substrate holder H. The growth chamber is evacuated to a ultra high vacuum ($10^{-11}$ Torr for example) by a high ability evacuation pump (not shown) connected thereto. It should be appreciated that the epitaxy apparatus according to the invention actually utilizes a plurality of substrate holders H each receiving a set of substrates B although only one of such holders is placed in the growth chamber 2 for one operating cycle.

Figure 2:
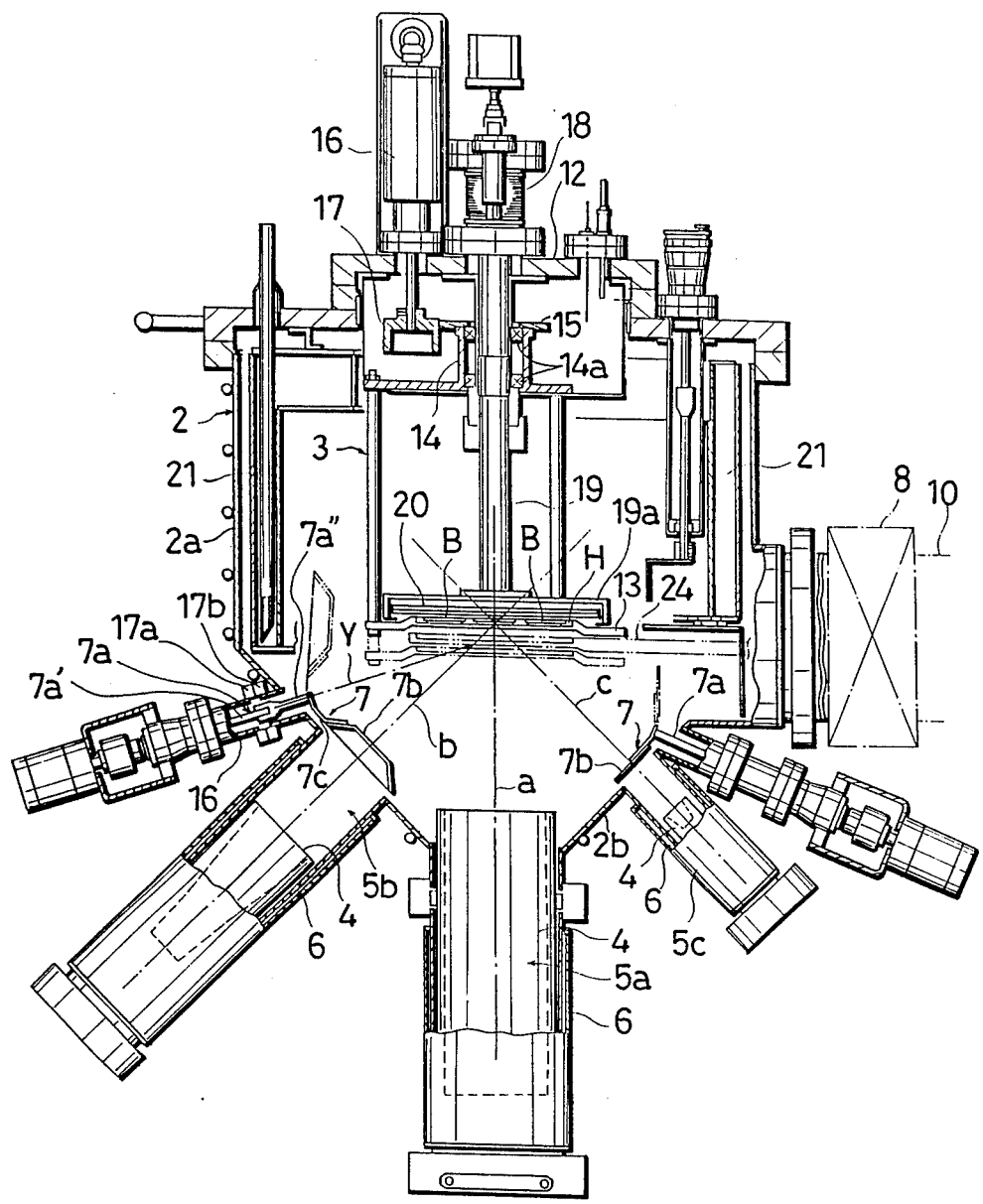
FIG. 2 is a sectional view taken on lines II—II in FIG. 1.

According to this example, the growth chamber 2 comprises an upright vessel which has a cylindrical upper portion 2a and a conical or frustoconical bottom portion 2b, as illustrated in vertical section in FIG. 2. The growth chamber further has a ceiling 12 centrally penetrated by a support shaft 19 which is movable up and down by means of an actuator 18 mounted on the ceiling 12 outside the growth chamber.

Within the growth chamber 2 is arranged a support frame 3 which is mounted on the support shaft 19. The support frame has, at its lower end, a pair of horizontal support arms 13 which are parallel to each other as spaced diametrically of the growth chamber (see also FIG. 1). The substrate holder H is placed on the support arms 13. The support frame further has an upper boss portion 14 which is rotatably fitted around the support shaft 9 by means of bearings 14a. The boss portion 14 carries a gear 15 in mesh with a drive pinion 17 which is rotated by an external motor 16 mounted on the ceiling 12. Thus, the support frame 3 together with the substrate holder H is rotated about the support shaft 19 upon actuation of the motor 16 to ensure uniform crystal growth on every substrate B. On the other hand, the support frame 3 is movable vertically with the support shaft 19 upon activation of the actuator 18. Such vertical movement of the support frame 3 is necessary to enable transfer of the substrate holder H to and from the support frame 3, as hereinafter described.

The support shaft 19 is provided at its lower end with a holder cover 19a in which is disposed a heater 20 for heating, from above, the substrates B to a desired temperature. On the other hand, an annular cooling shroud 21, to which is supplied liquid nitrogen, is arranged within the growth chamber 2 along the cylindrical portion 2a thereof. The cooling shroud 21 serves to provide a cooled inner surface on which vaporized impurities deposit.

The frustoconical bottom portion 2b of the growth chamber 2 is provided with a plurality of material vaporizers or molecular beam sources 5a, 5b, 5c which have respective axes a, b, c directed to the center of the substrate holder H. According to the illustrated example, the vaporizer 5a for a group V element (arsenic As for example) is disposed directly under the substrate holder H, whereas the remaining or side vaporizers b, c are disposed in an annular arrangement around the central vaporizer 5a. In FIG. 2, only two vaporizers 5b, 5c are shown besides the central vaporizer 5a to avoid complication of illustration. In reality, however, any number (five to seven for example) of such vaporizers may be arranged around the central vaporizer 5a depending on a desired composition of the crystal to be formed on each wafer B. For the convenience of subsequent description, all vaporizers 5a, 5b, 5c (and etc.) are equally referred to by reference numeral 5 unless distinction among them is necessary.

Each vaporizer 5 includes a crucible 4 for a suitable crystal material. The crucible is provided with a heater (not shown) for heating the crystal material to a specified temperature. The crucible is surrounded by a cylindrical cooling shroud 6 to which is supplied liquid nitrogen to make the vaporizer thermally independent of the other vaporizers and to prevent contamination by vapor impurities.

The crystal material in each crucible 4, when heated to the specified temperature under a ultra high vacuum, is emitted in the form of molecular or atomic beams to be deposited on each substrate B for crystal growth. Such crystal formation is initiated and interrupted by operating a shutter assembly 7 provided at each side vaporizer 5b, 5c.

The shutter assembly 7 includes a rotary shaft 7a projecting into the growth chamber 2, and a shutter plate 7b mounted on the projecting end of the rotary shaft. A more specific configuration of the shutter assembly will be described hereinafter. It suffices at this stage to mention that the shutter plate 7b is displaceable to close and open the outlet opening of the corresponding vaporizer upon rotation of the rotary shaft 7a.

The central vaporizer 5a is not provided with a shutter assembly. However, the absence of the shutter assembly with respect to the central vaporizer poses no problem in controlling the crystal growth, and is in fact preferred for the reasons to be described later.

Figure 4:
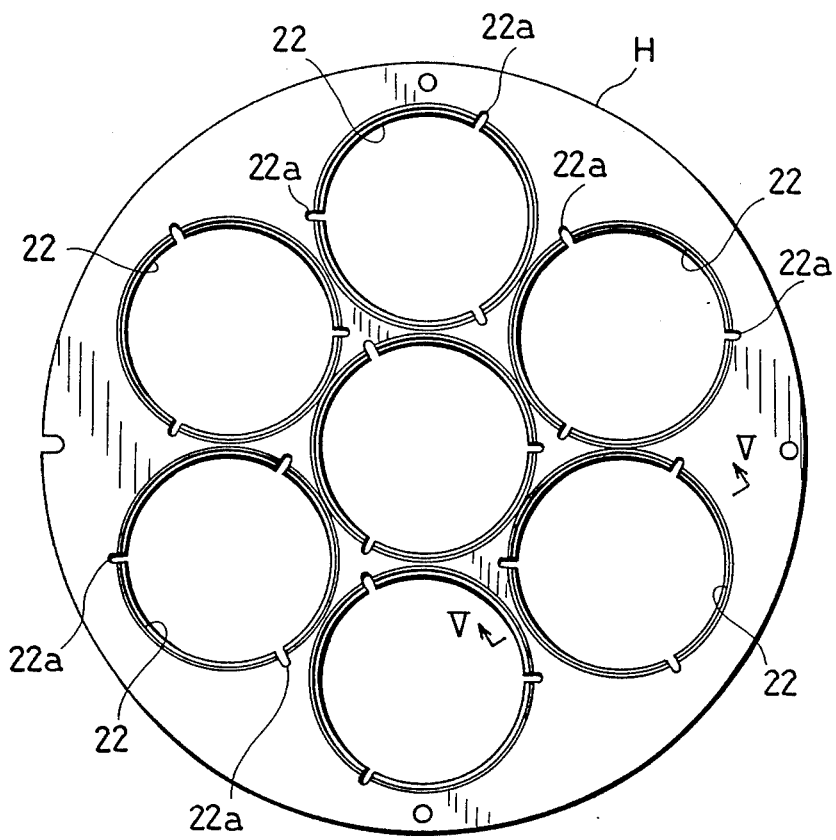
FIG. 4 is a plan view showing a substrate holder used in the MBE apparatus of FIG. 1.
Figure 5:
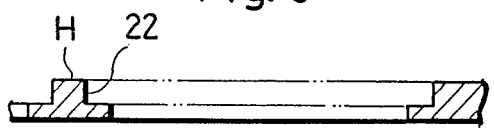
FIG. 5 is a sectional view taken on lines V—V in FIG. 4.

As shown in FIGS. 4 and 5, each substrate holder H, which is made of molybdenum or a molybdenum alloy, is in the form of a disc having a plurality (seven in FIG. 4) of stepped circular retaining holes 22. Each substrate B is fitted, from above, into a corresponding one of the retaining holes 22. Each retaining hole 22 is formed with a plurality (three in FIG. 4) of equiangularly spaced radial cutouts 22a for the purpose to be described later.

A set (seven according to the illustrated embodiment) of substrates B is placed onto a first transfer tray 23 within the loading chamber 11 (see FIG. 1), and then transferred onto a corresponding substrate holder H supported on a second transfer tray 24 within the preparation chamber 10. The set of substrates B retained by the substrate holder H is transferred into the growth chamber 2 by the advancing movement of the second transfer tray 24.

The preparation chamber 10, in which the second transfer tray 24 is movable, is cylindrical and extends horizontally from the growth chamber 2 substantially at the level of the support arms 13 of the support frame 3 (see FIG. 2). The loading chamber 11, in which the first transfer tray 23 is movable, is also cylindrical and extends horizontally from an intermediate portion of the preparation chamber 10 perpendicularly thereto (see also FIG. 3).

Figure 6:
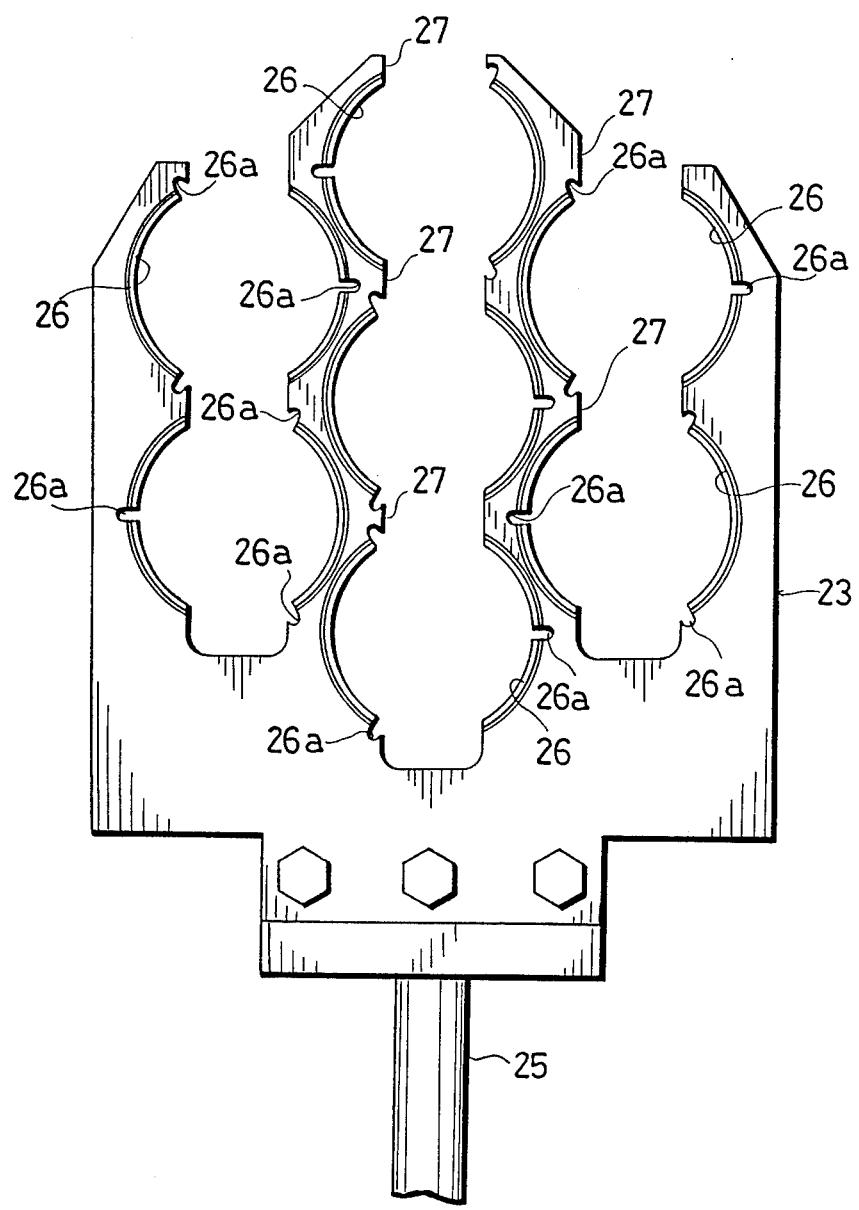
FIG. 6 is a plan view showing a first transfer tray incorporated in the MBE apparatus of FIG. 1.

As illustrated in FIG. 6, the first transfer tray 23 is formed with a plurality (seven according to this embodiment) of stepped circular retaining holes 26 in corresponding relation to those of each substrate holder H. These retaining holes 26 are connected to each other axially of the loading chamber 11 by straight passages 27 of a predetermined width opening toward the preparation chamber 10. The purpose of these passages 27 will be explained later. Each retaining hole 26 is provided with a plurality (three in FIG. 6) of equiangularly spaced cutouts 26a in corresponding relation to those of the substrate holder H.

The first transfer tray 23 is movable axially of the loading chamber 11 between a retreated position shown in solid lines in FIG. 1 and an advanced transfer position shown in phantom lines. The substrate transfer position is located where the axis of the loading chamber 11 intersects that of the preparation chamber 10. Such movement of the first tray 23 is imparted by an actuator (not shown) having an output rod 25 connected to the tray 23.

Figure 3:
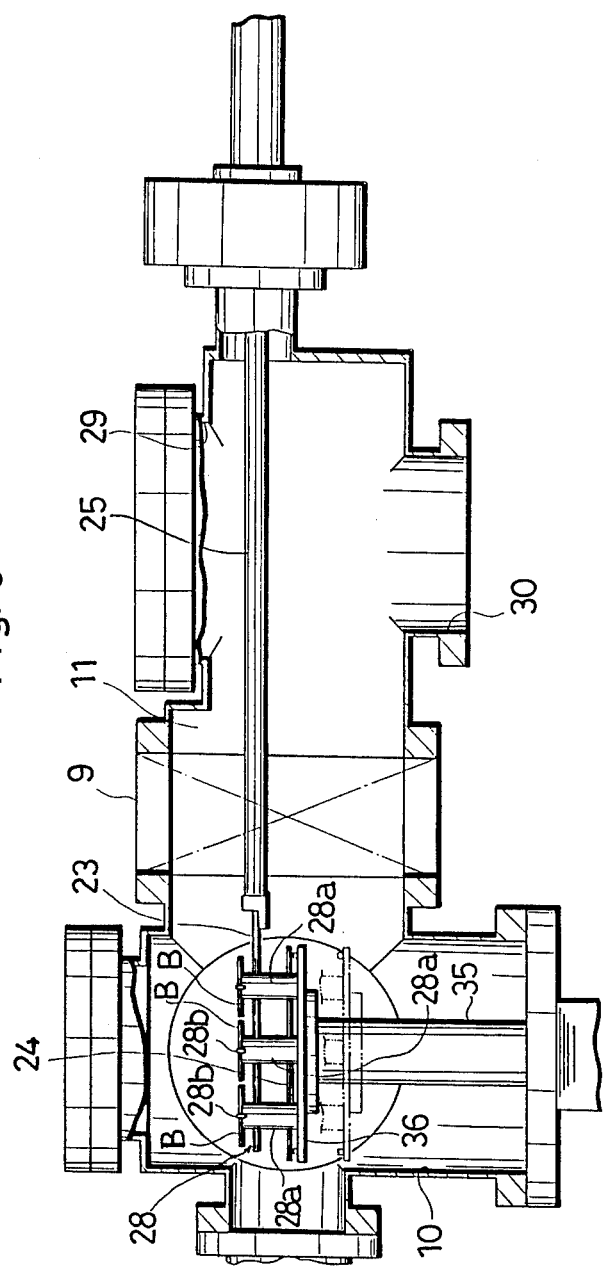
FIG. 3 is a sectional view taken on lines III—III in FIG. 1 to show a substrate transfer assembly.

As shown in FIG. 3, the loading chamber 11 is provided with an access opening 29 located immediately above the first transfer tray 23 which has been brought to its retreated position. The access opening 29 is hermetically closable, and used to supply a set of new substrates B and to take out a set of processed substrates. The loading chamber is further provided with an evacuation opening 30 connected to a vacuum pump for evacuating the loading chamber.

The second transfer tray 24 has a non-circular configuration defined by a pair of diametrically opposite arcs 24a and a pair of diametrically opposite chords 24b, as illustrated in FIG. 7. The pair of chords 24b are parallel to the axis of the preparation chamber 10. The width of the second tray, namely the distance between the chords 24b, is smaller than the distance between the support arms 13 of the support frame 3 (see FIG. 1), so that the second tray, when advance, can be positioned between the support arms 13.

The second tray 24 is formed with an upwardly opening recess 34 which is defined by a pair of stepped vertical wall surfaces 34a extending adjacent and along the profile arcs 24a, as illustrated in FIGS. 7 and 8. The recess 34 is used to fittingly receive each substrate holder H from above. The second tray 24 is further formed with a plurality (seven in FIG. 7) of circular passage holes 33 in corresponding relation to the retaining holes 22 of the substrate holder H. Each passage hole 33 is formed with a plurality (three in FIG. 7) of radial cutouts 33a in corresponding relation to those of the substrate holder. It should be note that two of the passage holes 33 are interrupted by the profile chords 24b of the tray.

Figure 9:
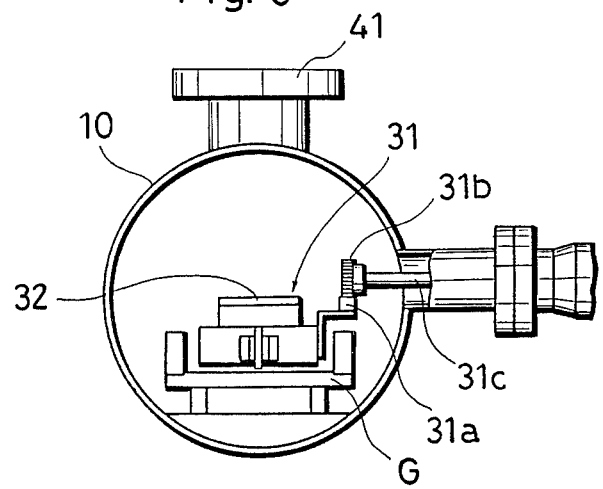
FIG. 9 is a sectional view taken on lines IX—IX in FIG. 1.

The second transfer tray 24 is movable axially of the preparation chamber 10 between an advanced position shown in phantom lines in FIG. 1 and a retreated transfer position shown in solid lines. Such movement of the second tray 24 is performed by a sliding feed assembly 31 which includes a slide rod or bar 32 connected to the second tray. Specifically, as better shown in FIG. 9, the slide rod 32 is slidably guided by a longitudinal guide G, and carries a rack 31a in mesh with a pinion 31b mounted to an output shaft 31c of an external drive motor 31d (FIG. 1). Thus, the slide rod 32 is moved back and forth by actuating the drive motor 31d. Indicated at 41 is an evacuation opening connected to an external vacuum source for evacuating the preparation chamber 10 to a high vacuum.

Transfer of each substrate set B between the first transfer tray 23 and the corresponding substrate holder H is conducted by a substrate transfer assembly 28 shown in FIGS. 3, 11 and 12. The substrate transfer assembly 28 is located at a position where the respective axes of the preparation chamber 10 and the loading chamber 11 intersect, namely where the first tray 23 in its advanced position overlaps the second tray 24 in its retreated position. As appreciated from FIG. 3, the first tray 23 is located slightly above the second tray 24.

The substrate transfer assembly 28 comprises a circular base plate 36 fixed to the upper end of a vertically extending support rod 35 which is moved up and down by an external actuator (not shown). The base plate 36 carries a plurality (seven in FIG. 12) of upstanding posts 28a in corresponding relation to the retaining holes 22 of each substrate holder H (FIG. 4). As better shown in FIG. 11, each post 28a is provided with a plurality of radially extending pawls 28a in corresponding relation to the radial cutouts 22a of the substrate holder H. These pawls are used to engage a corresponding substrate B from below at three peripheral portions thereof, thereby retaining it.

Obviously, the cutouts 22a (FIG. 4), 26a (FIG. 6), 33a (FIG. 7) are utilized to allow passage of the pawls 28a of the substrate transfer assembly 28 when the first tray 23, the second tray 24 and the substrate holder H are vertically overlapped, as shown in FIG. 3. Normally, the base plate 36 of the transfer assembly 28 assumes a lowered position in which the pawls 28b are located below the second tray 24, as indicated by phantom lines in FIG. 3. Due to the provision of the cutouts, however, the base plate 36 may be brought to a raised position in which the pawls are located above the first tray 23, as indicated in solid lines in FIG. 3.

Each substrate set B can be transferred from the first tray 23 to a corresponding substrate holder H on the second tray 24 in the following manner.

The first tray 23 with a set of newly loaded substrates B is brought to its advanced position (phantom line position in FIG. 1), whereas the second tray 24 with an empty substrate holder H is brought to its retreated position (solid line position in FIG. 1). At this time, the base plate 36 of the substrate transfer assembly 28 assumes its lowered position (phantom line position in FIG. 3). Subsequently, the base plate 36 is raised, so that the substrates B are lifted off the first tray 23 by the correspondingly raised pawls 28b, as indicated by solid lines in FIG. 3. In this condition, the first tray 23 is moved to its retreated position (solid line position in FIG. 1). Such retreating movement of the first tray 23 is possible because the substrate retaining holes 26 are interconnected by the straight passages 27 (FIG. 6) to clear the posts 28a in the axial direction of the loading chamber 11. Finally, the base plate 36 of the transfer assembly 28 is brought to its lowered position. Upon passage of the pawls 28a through the cutouts 22a of the substrate holder H, the substrates B held by the pawls are fitted into and retained by the respective retaining holes 22 (FIG. 4) of the holder.

A set of processed substrates B may be transferred from the corresponding substrate holder H to the first tray 23 for discharge by reversing the above operations. Specifically, the second tray 24 with the loaded substrate holder H supported thereon is brought to its retreated position, and the pawls 28a are raised to bring the processed substrates B off the holder to the highest position. Then, the first tray 23 is advanced, and the pawls 28a are lowered to place the substrates into the respective retaining holes 26 (FIG. 6) of the first tray 23.

The substrate holder H having loaded with the set of newly loaded substrates B is fed into the growth chamber 2 by the advancing movement of the second tray 24. According to the embodiment illustrated in FIG. 1, the holder H with the set of new substrates B is subjected to pretreatment in a preliminary heating unit 37 before being supplied into the growth chamber 2.

Figure 10:
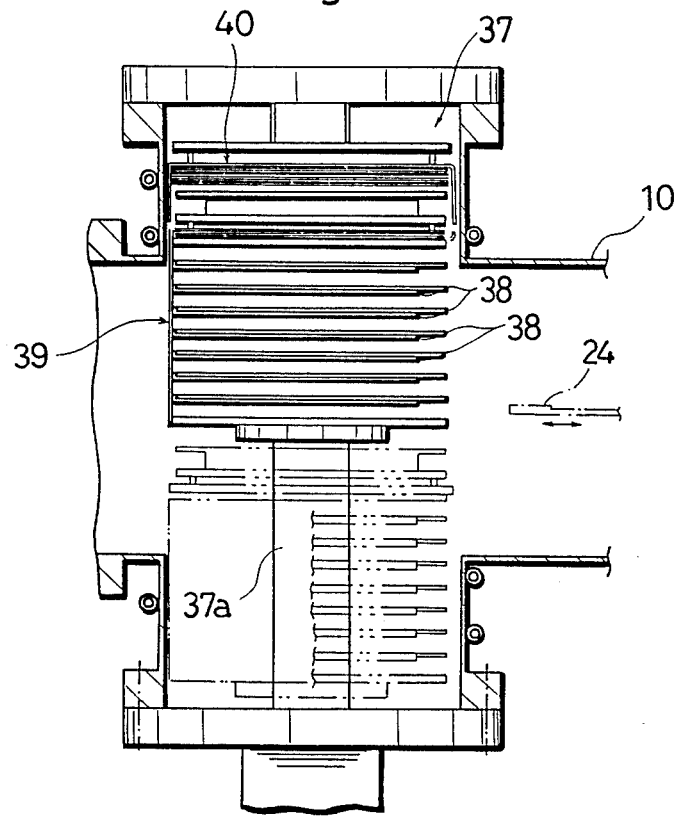
FIG. 10 is a sectional view taken on lines X—X in FIG. 1.

As shown in FIGS. 10 and 12, the preliminary heating unit 37 comprises a stocker 39 having a plurality of vertically aligned shelves 38. Each shelf 38 includes a pair of shelf plates 38a which are spaced transversely of the moving path of the second transfer tray 24 (see FIG. 12). The spacing between the pair of shelf plates is such as to enable engagement, from below, with the corresponding holder H while allowing free passage of the second tray 24 therebetween. The stocker 39 is supported on a vertical rod 37a which is movable up and down by means of an external actuator (not shown). Represented by reference numeral 40 is a heater to preliminarily heat each substrate B for degassing.

For storing each substrate holder H in the heating unit 37, the stocker 39 is adjusted in vertical position so that a selected shelf 38 is located slightly below the moving path of the second tray 24. Then, the second tray 24 with the substrate holder H is advanced to the stocker position, and the vertical rod 37 is raised. As a result, the holder is passed onto the selected shelf.

For transferring each stocked substrate holder H onto the second tray 24 from a particular shelf 38, the stocker 39 is adjusted in vertical position so that the shelf is positioned slightly above the path of the second tray. Subsequently, the tray 24 is advanced to the stocker to be positioned below that particular shelf but above the next lower shelf, whereupon the stocker 29 is lowered to pass the holder onto the second tray.

The substrate holder H thus received from the stocker 39 can be transferred onto the support frame 3 (FIGS. 1, 2 and 12) within the growth chamber 2 in the following manner.

The support frame 3 is adjusted in vertical and rotational position so that its support arms 13 become parallel to the moving path of the second tray 24 as located slightly thereunder. Subsequently, the second tray with the loaded substrate holder H is advanced maximally into the growth chamber 2. In this condition, the second tray is arranged between the support arms 13. Finally, the support frame 3 is raised without rotation, whereby the holder H is lifted off the second tray which is thereafter retreated into the preparation chamber 10.

After crystal growth is completed within the growth chamber 2, the holder H with the processed substrates B is transferred from the support frame 3 to the second tray 24 by reversing the above operations.

Overall operation of the molecular beam epitaxy apparatus thus described will now be described more systematically with reference to FIGS. 1 and 12 in particular.

It is now assumed that the growth chamber 2 has been previously evacuated to a ultra high vacuum and ready for crystal growth, while the preparation chamber 10 has been put under a high vacuum. In this condition, the first and second gate valves 8, 9 are hermetically closed to prevent vacuum leakage. Within the preparation chamber 10, the second tray 24 supporting an empty substrate holder H (taken from the preliminary heating unit 37) assumes its retreated position to wait for substrate supply. Within the loading chamber 11, the first tray 23 also assumes its retreated position as ready for substrate supply.

Starting from the above condition, the access opening 29 (see FIG. 3) of the loading chamber 11 is opened to supply a fresh set of substrates B to the respective retaining holes 26 (see FIG. 6) of the first tray 23. The access opening is then closed, and the loading chamber is evacuated to a vacuum level corresponding to that of the preparation chamber 10.

The second gate valve 9 is opened, and the first tray 23 is advanced into the preparation chamber 10 to be positioned immediately above the second tray 24. The substrate transfer assembly 28 is operated to transfer the substrates B into the respective retaining holes 22 (FIG. 4) of the holder H, as already described. The first tray 23 is withdrawn into the loading chamber 11 to assume its retreated position, and the second gate valve 9 is again closed to enable loading of another fresh set of substrates.

Within the preparation chamber 10, the second tray 24 now supporting the loaded holder H advances to the preliminary heating unit 37 to place the holder onto a selected shelf 38 of the stocker 39 (FIG. 10), as described hereinbefore. The second tray 24 repeats reciprocating movement between the heating unit 37 and the retreated position until all holders in the stocker 39 are fully loaded. The holders H together with the substrates B are subjected to heating for degassing under high vacuum.

Upon completion of the above preparatory steps, the first gate valve 8 is opened. Thereafter, the second tray 24 having received a loaded holder H from the heating unit 37 is advanced further into the growth chamber 2 to place it onto the support frame 3, as described hereinbefore. The second tray 24 is then retracted into the preparation chamber 10, and the first gate valve 8 is again closed.

Within the growth chamber 2, the holder H together with the retained substrates B is further degassed under heating (by the heater 20) and ultra high vacuum. Each substrate then undergoes crystal growth by the molecular beam epitaxy. During such crystal formation, the support frame 3 is rotated about a vertical axis to ensure uniform crystal growth with respect to every substrate.

Upon completion of required crystal growth, the first gate valve 8 is again opened to bring the growth chamber 2 into communication with the preparation chamber 10 which has been evacuated to a high vacuum. The support frame 3 is adjusted in vertical and rotational position for substrate discharge, and the second tray 24 is maximally advanced to receive, from the support frame 3, the holder H with the set of processed substrates B. During this cycle, the second gate valve 9 is closed.

The second tray 24 is retracted to assume its maximally retreated position, and the first valve 8 is closed. By this time, the loading chamber 11 has been evacuated to a high vacuum. Then, the second gate valve 9 is opened, and the first tray 23 is advanced to receive the set of processed substrates B from the holder H with the aid of the transfer assembly 28, as hereinbefore described.

The first tray 23 with the processed substrates B is retreated, and the second gate valve 9 is again closed. The access opening 29 (FIG. 3) is then opened to take out the processed substrates. If required, the first tray 23 may receive a new set of substrates immediately after taking out the processed substrates.

Within the preparation chamber 10, the second tray 24 supporting the emptied holder H may be advanced immediately to return the empty holder into the heating unit 37. Alternatively, the second tray with the empty holder may stay retreated until the holder is loaded with a new set of substrates, and thereafter advanced to store the loaded holder in the heating unit 37. This alternative enables continuous running of the epitaxy apparatus.

It should be appreciated that the above manner of operation is only one example. The epitaxy apparatus of the invention can be operated in different ways. For example, each substrate holder H may be fed into the growth chamber 2 without pretreatment at the heating unit 37 immediately after loaded with a set of unprocessed substrates B.

In either manner of operation, each substrate holder H moves only between the growth chamber 2 under ultra high vacuum and the preparation chamber 10 under high vacuum. In other words, the holder H never comes into direct contact with the atmosphere and/or the contaminating surroundings during repeated operation of the epitaxy apparatus, thereby greatly reducing the time required for removing contaminants by degassing within the growth chamber 2 under heating and ultra high vacuum. Thanks to this, the productivity of the molecular beam epitaxy apparatus according to the invention is improved enough to allow practical use on a commercial scale.

It is virtually inevitable in any epitaxy apparatus that substrates themselves come into contact with the atmosphere. The point of the invention, therefore, resides in reducing the chance of contaminant entry into the growth chamber as much as possible.

Returning to FIG. 2, the central vaporizer 5a, unlike the side vaporizers 5b, 5c, is not provided with a shutter assembly, as already described. To explain the reasons for this, reference is now made to further details of the molecular beam epitaxy.

It is known in molecular beam epitaxy that the rate of deposition of certain crystal elements is determined by the amount of other elements already deposited on the growth front of a substrate. Now, the concept of "coefficient of deposition" is used, which is defined as the ratio in number of deposited particles (molecules) to incident particles. When depositing a group V element, arsenic As ($As_2$ or $As_4$ molecule) for example, onto the growth front of a GaAs substrate, the coefficient of deposition of As is almost 1 (one) in the presence of deposited Ga or Al on the growth front but reduces almost to 0 (zero) in the absence of Ga or Al. It is thus possible to indirectly control the deposition of the group V elements by controlling the deposition of the other elements.

It is also known that the group V elements emit molecular beams at a relatively low temperature of about 300° C. as opposed to the other elements. Thus, it is easier to initiate and interrupt the molecular beam emission of the group V elements by temperature control.

For these reasons, the central vaporizer 5a for a group V element (arsenic As in particular) is not provided with a shutter assembly. The molecular beam emission from the central vaporizer is controlled by adjusting the temperature thereof, while the deposition of As on the growth face of each substrate B is controlled by controlling the shutter assembly 7 of each side vaporizer 5b, 5c.

In fact, the consumption of a group V element is highest in molecular beam epitaxy. Therefore, a large capacity vaporizer for such an element is required to provide continued or repeated crystal growth per single supply batch of that material. If this vaporizer is provided with a shutter plate large enough to cover the emission opening of the vaporizer, other vaporizers must be located relatively away from the V element vaporizer to allow the opening movement of the large shutter plate. Due to the limited mounting space of a growth chamber, however, there is also a limitation on the size of the shutter plate, that is, on the size of the vaporizer. Thus, with a conventional MBE apparatus in which all vaporizers are provided with shutter assemblies, the group V element vaporizer cannot have a sufficient capacity, thereby requiring frequent recharging of the material.

Apparently, non-provision of a shutter assembly with respect to the central vaporizer 5a not only simplifies the structure of the growth chamber 2, but also is advantageous in increasing the capacity (volume) of the crucible 4 for receiving As. In this way, it is possible to run the apparatus for a prolonged period with a single operation of material supply while reducing the likelihood of running failures and the frequency of maintenance.

According to the particular arrangement shown in FIG. 2, the V element vaporizer 5a is located at the center of the frustoconical bottom portion 2b of the growth chamber 2, whereas the remaining vaporizers are disposed around the central vaporizer. This arrangement also contributes to increasing the capacity of the central crucible 4 while enabling to arrange a maximum number of other vaporizers around the central vaporizer.

Thanks to the absence of a shutter assembly, the central vaporizer 5a may have its emission opening projecting toward the substrates B. This arrangement is advantageous in reducing stray molecular beams (undeposited material), consequently preventing material waste.

On the other hand, it is feared that the non-closable emission opening of the central vaporizer 5a may allow impurity fallings to mix with the material (V element) therein. However, as described above, the V element vaporizer 5a works at a relatively low temperature, so that the mixed fallings will not vaporize at the working temperature of the central vaporizer.

As illustrated in FIG. 2, the rotary shaft 7a of each shutter assembly 7 has an axis Y which approaches the longitudinal axis b (or c) of the corresponding vaporizer 5b (or 5c). The shutter plate 7b is connected to the rotary shaft 7a by a bent arm 7c in a manner such that the shutter plate 7b becomes substantially parallel to the emission opening of the vaporizer when the shutter plate assumes a closing position. According to this arrangement, the shutter plate 7b is located nearest to the wall surface of the growth chamber 2 in the closing position, but becomes gradually farther from the wall surface upon opening movement, as indicated by phantom lines.

On the other hand, if the pivotal axis Y of the shutter plate 7b is parallel to the longitudinal axis of the vaporizer, the shutter plate 7b approaches the wall surface of the growth chamber 2 upon opening movement because the bottom portion 2b of the growth chamber is conical. Thus, the shutter plate 7b, when assuming its closing position, must be located away from the emission opening of the corresponding vaporizer in order to allow opening movement of the shutter plate. As a result, the shutter plate 7b in the closing position may fail to effectively cut off molecular beams, thereby hindering accurate control of crystal growth on one hand and permitting leakage of vaporized material on the other. Further, if the shutter plate 7b in the closing position is located unacceptably adjacent the emission opening of the vaporizer, it will come into contact with the chamber wall surface to produce unwanted impurities due to contact shocks which may give adverse influences on crystal growth.

The non-parallel orientation of the pivotal axis Y relative to the corresponding vaporizer axis is therefore advantageous in that the shutter plate 7b in its closing position may be located maximally close to the emission opening of the vaporizer without the problem of impurity production, consequently enabling accurate control of crystal growth. This arrangement is further advantageous in preventing vapor leakage when the shutter plate assumes its closing position.

Figure 13A:
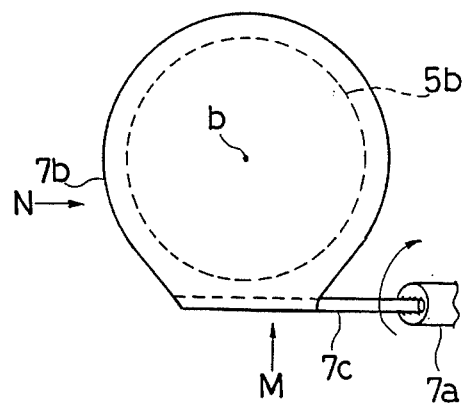
FIGS. 13a to 13c are views showing a preferred shutter assembly as seen in three different directions.
Figure 13B:
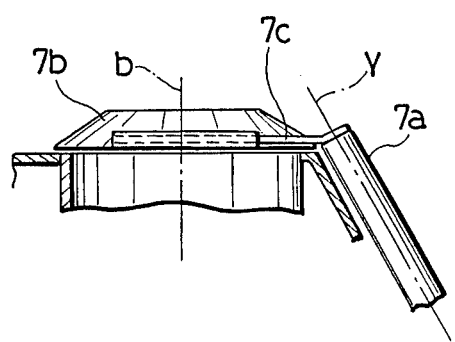
Figure 13C:
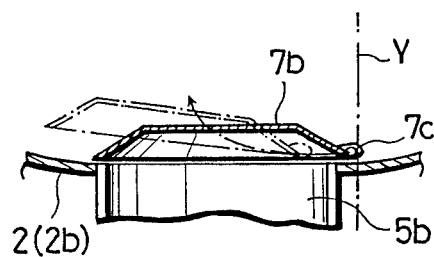
Figure 14:
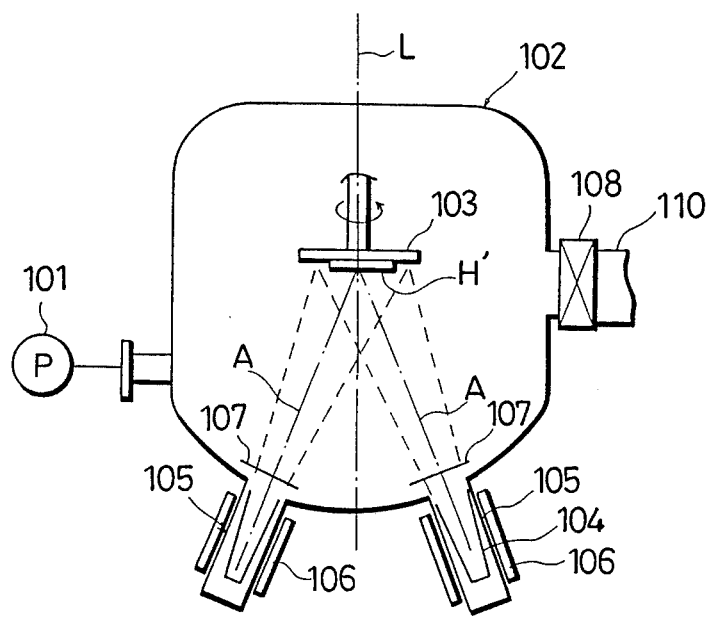
FIG. 14 is a schematic view in vertical section showing the growth chamber of a prior art MBE apparatus.
Figure 15:
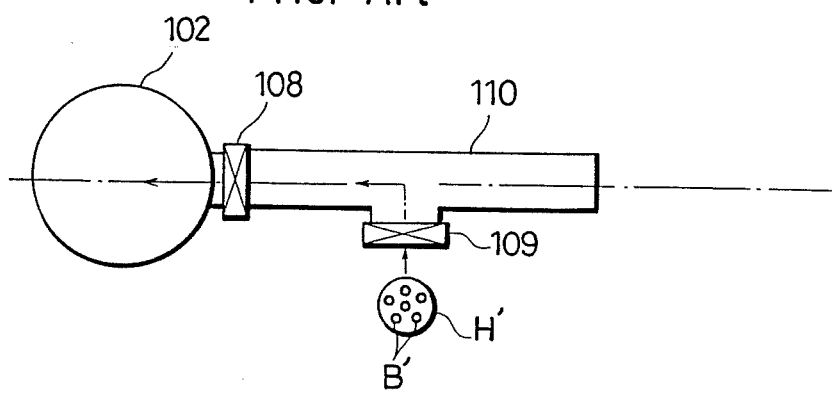
FIG. 15 is a plan view showing the prior art MBE apparatus with a means of supplying substrates.

As shown in FIGS. 13a to 13c, the bent arm 7c of the shutter assembly preferably extends tangentially to the generally circular shutter plate 7b and is connected the trailing edge thereof (as seen in the direction of the shutter opening movement). It should be appreciated here that FIG. 13b is a view as seen in the direction of an arrow M in FIG. 13a which is a plan view of the shutter plate, whereas FIG. 13c is a view as seen in the direction of an arrow N in FIG. 13a.

According to the preferred arrangement of FIGS. 13a to 13c, all portions of the shutter plate 7b displace away from the wall surface of the growth chamber 2 (or the conical bottom portion 2b thereof) immediately upon start of the shutter opening movement, as best illustrated in FIG. 13c. Therefore, the shutter plate 7b may be located even nearer the emission opening of the corresponding vaporizer.

Referring again to FIG. 2, the rotary shaft 7a of each shutter assembly 7 should preferably includes two axially separable portions 7a', 7a" connected by a transversing bolt (not shown). The rotary shaft is enclosed in a tubular housing 16 which also has two axially separable portions respectively provided with annular flanges 17a, 17b for connection by bolting.

For removing the shutter plate 7b for cleaning for example, the flanges 17a, 17b of the tubular housing 16 are axially separated slightly. At this time, the two shaft portions 7a', 7a" are still connected and pulled downward together. Subsequently, a suitable tool such as a driver is introduced into the tubular housing 16 through a small gap between the separated flanges 17a, 17b, and the bolt (not shown) connecting the two shaft portions 7a', 7a" is removed. Finally, the shutter plate 7b together with the upper shaft portion 7a" are taken out through a hermetically closable view port (not shown) of the growth chamber 2 or through the upper opening of the growth chamber 2 (after removal of the ceiling plate 12). Obviously, remounting of the shutter plate 7b may be conducted in the reverse order.

Conventionally, all operations required for removing and remounting of a shutter plate must be conducted by inserting the operator's hands through a narrow view port of a growth chamber, which is really time-taking and troublesome. According to the preferred shutter assembly 7 shown in FIG. 2, on the other hand, most operations for shutter removal and remounting can be conducted from outside at the position of the annular flanges 17a, 17b.

The invention being thus described, it is obvious that the same may be modified in various ways. For instance, the central vaporizer 5a may also be provided with a shutter assembly. Further, the configuration of each shutter assembly is optional. Such variations are not to be regarded as a departure from the spirit and scope of the invention, and all such modifications as would be obvious to those skilled in the art are intended to be included within the scope of the following claims.

We claim:

1. A molecular beam epitaxy apparatus comprising:
   a growth chamber evacuatable to an ultra high vacuum,
   holder support means arranged in said growth chamber,
   a preparation chamber connected to said growth chamber via a first gate valve and evacuatable to a high vacuum,
   a loading chamber connected to said preparation chamber via a second gate valve and evacuatable to a high vacuum,
   a first transfer member arranged in said loading chamber for receiving at least one substrate at a time, said first member being movable into said preparation chamber through the open second valve to assume an advanced transfer position,
   a second transfer member arranged in said preparation chamber for placing thereon a substrate holder, said second member being movable from a retreated transfer position in said preparation chamber into said growth chamber through the open first valve to enable transfer of the holder between said second member and said holder support means, and
   a substrate transfer assembly arranged in said preparation chamber to transfer the, or each, substrate between said first member in said advanced transfer position and the holder placed on said second member in said retreated transfer position,
   wherein said holder support means is in the form of a support frame having a pair of spaced horizontal support arms engageable with the substrate holder from below.

2. The apparatus as defined in claim 1, wherein said second transfer member has a width smaller than the spacing between said pair of support arms so that said second transfer member is movable to a position between said pair of support arms, said support frame being vertically movable to enable transfer of the substrate holder between said second transfer member and said pair of support arms.

3. A molecular beam epitaxy apparatus comprising:
   a growth chamber evacuatable to an ultra high vacuum,
   holder support means arranged in said growth chamber,
   a preparation chamber connected to said growth chamber via a first gate valve and evacuatable to a high vacuum,
   a loading chamber connected to said preparation chamber via a second gate valve and evacuatable to a high vacuum,
   a first transfer member arranged in said loading chamber for receiving at least one substrate at a time, said first member being movable into said preparation chamber through the open second valve to assume an advanced transfer position,
   a second transfer member arranged in said preparation chamber for placing thereon a substrate holder, said second member being movable from a retreated transfer position in said preparation chamber into said growth chamber through the open first valve to enable transfer of the holder between said second member and said holder support means, and
   a substrate transfer assembly arranged in said preparation chamber to transfer the, or each, substrate between said first member in said advanced transfer position and the holder placed on said second member in said retreated transfer position,
   wherein the substrate holder comprises a plurality of retaining holes in which a corresponding number of substrates are fitted and retained, and
   wherein said second transfer member is in the form of a tray having a plurality of passage holes in corresponding relation to the retaining holes of the substrate holder, and said first transfer member is also in the form of a tray having a plurality of retaining holes in corresponding relation to the retaining holes of the substrate holder for receiving and retaining a corresponding number of substrates.

4. The apparatus as defined in claim 3, wherein said first transfer tray in said advanced transfer position is located immediately above said second transfer tray in said retreated transfer position.

5. The apparatus as defined in claim 4, wherein said substrate transfer assembly comprises a plurality of upright posts mounted on a vertically movable base, each post being formed at its upper end with a plurality of radially extending pawls for engaging a corresponding substrate from below and lift it off the substrate holder when said base is raised, each hole of the substrate holder, said first transfer tray and said second transfer tray being formed with a plurality of radial cutouts in corresponding relation to said pawls of said each post to allow passage of said pawls.

6. The apparatus as defined in claim 5, wherein said retaining holes of said first transfer tray are arranged in straight rows, the retaining holes in each row being interconnected by a straight passage to allow said first transfer tray to retreat into said loading chamber even when said base of said substrate assembly is raised.

7. A molecular beam epitaxy apparatus comprising:
   a growth chamber evacuatable to an ultra high vacuum,
   holder support means arranged in said growth chamber,
   a preparation chamber connected to said growth chamber via a first gate valve and evacuatable to a high vacuum,
   a loading chamber connected to said preparation chamber via a second gate valve and evacuatable to a high vacuum,
   a first transfer member arranged in said loading chamber for receiving at least one substrate at a time, said first member being movable into said preparation chamber through the open second valve to assume an advanced transfer position, a second transfer member arranged in said preparation chamber for placing thereon a substrate holder, said second member being movable from a retreated transfer position in said preparation chamber into said growth chamber through the open first valve to enable transfer of the holder between said second member and said holder support means, and a substrate transfer assembly arranged in said preparation chamber to transfer the, or each, substrate between said first member in said advanced transfer position and the holder placed on said second member in said retreated transfer position, further comprising a preliminary heating unit arranged in said preparation chamber between said growth chamber and said retreated position of said second transfer member for degassing the substrate held by the holder before entry into the growth chamber, wherein said preliminary heating unit comprises a stocker for storing a plurality of substrate holders in vertically spaced stages, and wherein each stage of said stocker is provided by a pair of shelf plates which are spaced transversely of the moving path of said second transfer member, said pair of shelf plates being engageable with a corresponding substrate holder from below but spaced enough to allow passage of said second transfer member.

8. The apparatus as defined in claim 7, wherein said stocker is vertically movable so that said stocker itself functions to enable transfer of each substrate holder between said second transfer member and said stocker.

9. A molecular beam epitaxy apparatus comprising:
a growth chamber evacuatable to an ultra high vacuum,
holder support means arranged in said growth chamber,
a preparation chamber connected to said growth chamber via a first gate valve and evacuatable to a high vacuum,
a loading chamber connected to said preparation chamber via a second gate valve and evacuatable to a high vacuum,
a first transfer member arranged in said loading chamber for receiving at least one substrate at a time, said first member being movable into said preparation chamber through the open second valve to assume an advanced transfer position,
a second transfer member arranged in said preparation chamber for placing thereon a substrate holder, said second member being movable from a retreated transfer position in said preparation chamber into said growth chamber through the open first valve to enable transfer of the holder between said second member and said holder support means, and
a substrate transfer assembly arranged in said preparation chamber to transfer the, or each, substrate between said first member in said advanced transfer position and the holder placed on said second member in said retreated transfer position,
wherein said growth chamber has a mounting portion which is provided with a vaporizer for a group V element as well as with other vaporizers for additional materials, said group V element vaporizer having a non-closable emission opening, each of said vaporizers having a longitudinal axis directed toward the center of the holder supported by said holder support means, and said molecular beam epitaxy apparatus being free of any obstruction moveable into an emmission path between said group V element vaporizer and the supported holder.

10. The apparatus as defined in claim 9, wherein said mounting portion is a frustoconical bottom portion of said growth chamber.

11. The apparatus as defined in claim 9, wherein said group V element vaporizer is located in direct opposition to said holder support means, said other vaporizers being disposed around said group V element vaporizer in an annular arrangement.

12. The apparatus as defined in claim 10, wherein said group V element vaporizer is located directly below said holder support means, said other vaporizers being disposed around said group V element vaporizer in an annular arrangement.

13. The apparatus as defined in claim 9, wherein said emission opening of said group V element vaporizer projects toward said holder support means.

14. The apparatus as defined in claim 9, wherein each of said other vaporizers is provided with a shutter assembly which includes a shutter plate pivotable about a rotational axis which approaches, in the direction toward said holder support means, the longitudinal axis of the corresponding vaporizer.

15. The apparatus as defined in claim 14, wherein said rotational axis of said shutter assembly is provided by a rotary shaft which is connected to said shutter plate by an arm, said arm extending substantially tangentially to said shutter plate.

16. The apparatus as defined in claim 9, wherein each of said other vaporizers is provided with a shutter assembly which includes a shutter plate pivotable about a rotary shaft, said rotary shaft having two axially separable portions accommodated in a housing which also has two axially separable portions.

17. A molecular beam epitaxy apparatus comprising:
a growth chamber evacuatable to an ultra high vacuum, said growth chamber being provided with vaporizers for emitting crystal growth materials,
holder support means arranged in said growth chamber,
a preparation chamber connected to said growth chamber via a first gate valve and evacuatable to a high vacuum,
a loading chamber connected to said preparation chamber via a second gate valve and evacuatable to a high vacuum,
a first transfer member arranged in said loading chamber for receiving at least one substrate at a time, said first member being movable into said preparation chamber through the open second valve to assume an advanced transfer position,
a second transfer member arranged in said preparation chamber for placing thereon a substrate holder, said second member being movable from a retreated transfer position in said preparation chamber into said growth chamber through the open first valve to enable transfer of the holder between said second member and said holder support means, and
a substrate transfer assembly arranged in said preparation chamber to transfer the, or each, substrate between said first member in said advanced transfer position and the holder placed on said second member in said retreated transfer position,
wherein at least one of said vaporizers is provided with a shutter assembly which includes a shutter plate pivotable about a rotary shaft, said rotary shaft having two axially separable portions accommodated in a housing which also has two axially separable portions.

* * * * *